(12) United States Patent
Li et al.

(10) Patent No.: US 9,971,002 B2
(45) Date of Patent: May 15, 2018

(54) LOCAL COIL AND MAGNETIC RESONANCE IMAGING SYSTEM

(71) Applicants: Wen Ming Li, Shenzhen (CN); Tong Tong, Shenzhen (CN); JianMin Wang, Shenzhen (CN)

(72) Inventors: Wen Ming Li, Shenzhen (CN); Tong Tong, Shenzhen (CN); JianMin Wang, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 679 days.

(21) Appl. No.: 14/167,995

(22) Filed: Jan. 29, 2014

(65) Prior Publication Data

US 2014/0210475 A1 Jul. 31, 2014

(30) Foreign Application Priority Data

Jan. 30, 2013 (CN) .......................... 2013 1 0035292

(51) Int. Cl.
*G01R 33/36* (2006.01)
*G01R 33/34* (2006.01)

(52) U.S. Cl.
CPC .... *G01R 33/3628* (2013.01); *G01R 33/34084* (2013.01)

(58) Field of Classification Search
CPC .......... G01R 33/34084; G01R 33/3635; G01R 33/285; G01R 33/3628; G01R 33/3657; G01R 33/3415; G01R 33/34076; G01R 33/341; G01R 33/0283; G01R 33/287; G01R 33/33692; A61B 5/055; H03B 2201/0208; H03B 2201/0266; H03J 2200/10

See application file for complete search history.

(56) References Cited

U.S. PATENT DOCUMENTS

| 2008/0106264 A1* | 5/2008 | Fischer .................. A61B 5/055 324/322 |
| 2010/0277175 A1* | 11/2010 | Weiss ................. G01R 33/0283 324/318 |
| 2011/0125005 A1* | 5/2011 | Misic ................... G01R 33/285 600/423 |

(Continued)

OTHER PUBLICATIONS

SIPO Office Action on related application.*

*Primary Examiner* — Clayton E Laballe
*Assistant Examiner* — Ruifeng Pu
(74) *Attorney, Agent, or Firm* — Lempia Summerfield Katz LLC

(57) ABSTRACT

A local coil and a magnetic resonance imaging system are provided. The local coil includes an antenna part, an adjustment part and a transmission part. The antenna part includes a first capacitor connected in series for adjusting a frequency of the antenna part. The adjustment part includes a tuning/detuning diode and is connected in parallel to the first capacitor, and the tuning/detuning diode is used for adjusting tuning and detuning of the antenna part. The transmission part includes a radio-frequency transmission line that connects the antenna part and the adjustment part, and the transmission part provides a phase difference of an odd multiple of 180° between the antenna part and the tuning/detuning diode.

12 Claims, 2 Drawing Sheets

(56) References Cited

U.S. PATENT DOCUMENTS

| | | | | |
|---|---|---|---|---|
| 2013/0069652 A1* | 3/2013 | Otake | ................ | G01R 33/3664 |
| | | | | 324/322 |
| 2013/0113484 A1* | 5/2013 | Kumar | ............... | G01R 33/3628 |
| | | | | 324/318 |
| 2013/0249558 A1* | 9/2013 | Marek | .................... | G01R 33/58 |
| | | | | 324/322 |

* cited by examiner

LOCAL COIL AND MAGNETIC RESONANCE IMAGING SYSTEM

This application claims the benefit of CN 201310035292.8, filed on Jan. 30, 2013, which is hereby incorporated by reference in its entirety.

TECHNICAL FIELD

The present embodiments relate to the technical field of magnetic resonance imaging.

BACKGROUND

Magnetic resonance imaging (MRI) is a technique using magnetic resonance for imaging. The principle of magnetic resonance includes nuclei containing protons (e.g., the proton of a hydrogen nucleus) widely existing in the human body that have a spinning movement (e.g., like a small magnet), and the spin axes of these small magnets do not have a certain rule. If an external magnetic field is applied, these small magnets will be rearranged according to the magnetic force lines of the external magnetic field, and arranged in two directions that are parallel or antiparallel to the magnetic force lines of the external magnetic field. The direction parallel to the magnetic force lines of the external magnetic field is called a positive longitudinal axis, and the direction antiparallel to the magnetic force lines of the external magnetic field is called a negative longitudinal axis. The nuclei only have a longitudinal magnetization component, and the longitudinal magnetization component has both direction and amplitude. Nuclei in the external magnetic field are excited by a radio-frequency (RF) pulse with a specific frequency to make the spin axes of these nuclei deviate from the positive longitudinal axis or the negative longitudinal axis to produce resonance. This is magnetic resonance. After the spin axes of the excited nuclei deviate from the positive longitudinal axis or the negative longitudinal axis, the nuclei have a transverse magnetization component. After stopping transmitting radio-frequency pulses, the excited nuclei transmit echo signals to release the absorbed energy step by step in the form of electromagnetic waves. The phase and energy level thereof both recover to the state before being excited, and the image may be reconstructed after the echo signals transmitted by the nuclei are subjected to further processing such as space encoding.

The magnetic resonance imaging (MRI) system includes various coils such as, for example, a body coil covering the whole body area and a local coil only covering some part of the body. A local coil having a receiving antenna is widely used in the magnetic resonance imaging system. The local coil is applicable to different body parts of different sizes with a good signal to noise ratio. The local coil may have multiple functions. For example, flexible coils manufactured by Siemens may be used for magnetic resonance imaging of all parts of a human body, such as, for example, chest/abdomen/elbow/knee/ankle/head.

Inside the local coil is a receiving antenna, and outside the local coil is a layer of soft material, so that the local coil has the feature of flexibility. However, the receiving antenna inevitably has rigid components or large components such as, for example, diodes, sensors, and capacitors. For example, an active detuning circuit and a passive detuning circuit of the receiving antenna use rigid elements such as a printed circuit board (PCB). In order to protect the rigid elements, a plastic box may be used as a rigid housing. The abovementioned method is often used in places such as a body array coil and a flexible coil of a Siemens magnetic resonance imaging system.

However, the rigid housing has the following defects while protecting the rigid elements.

1. The flexibility of the receiving antenna is reduced, and the application of the local coil is limited. For a mini size coil, the bending angle of the antenna is very small.

2. Since the rigid components and the flexible parts are connected, the antenna is easily damaged. This is true for the connection positions of the rigid components and the flexible parts under long-time bending.

3. The size of the receiving antenna may not be made sufficiently small due to the adoption of the rigid housing.

In addition, due to the error in the capacitance value of the PCB and the manufacturing error in the copper plating structure of the antenna, an adjustable capacitor is to be adopted to make the frequency of the local coil match the operating frequency of the system. However, the adjustable capacitor may be larger in size and is difficult to be used in the flexible coil. In addition, after the rigid part of the local coil is covered by the flexible material, the frequency of the local coil may be unadjustable. The practice in the prior art is to adjust the capacitor to the operating frequency of the system before covering the rigid part with the flexible material. In many cases, after the flexible material is covered, the frequency of the local coil still does not match the operating frequency of the system, so that the local coil may only be scrapped.

SUMMARY AND DESCRIPTION

The scope of the present invention is defined solely by the appended claims and is not affected to any degree by the statements within this summary.

The present embodiments may obviate one or more of the drawbacks or limitations in the related art. In one embodiment, a local coil that includes an antenna part, an adjustment part and a transmission part is provided. The antenna part includes a first capacitor connected in series for adjusting a frequency of said antenna part. The adjustment part includes a tuning/detuning diode and is connected in parallel to the first capacitor. The tuning/detuning diode is used for adjusting the tuning and detuning of the antenna part. The transmission part includes a radio-frequency transmission line that connects the antenna part and the adjustment part. The transmission part provides a phase difference of an odd multiple of 180° between the antenna part and the tuning/detuning diode.

In one implementation, the transmission part also includes a phase converter connected between the radio-frequency transmission line and the tuning/detuning diode.

In one implementation, the phase converter is a n-shaped or T-shaped phase conversion circuit.

In one implementation, the first capacitor includes a varactor diode.

In one implementation, the first capacitor further includes a fixed value capacitor connected in parallel to the varactor diode.

In one implementation, the adjustment part further includes a voltage divider for adjusting the voltage across the varactor diode.

In one implementation, the voltage divider is a resistance voltage divider connected in parallel to the tuning/detuning diode.

In one implementation, the antenna part further includes a second capacitor for adjusting a matching impedance flexible housing of the antenna part, and the antenna part further includes a fuse connected in series to the first capacitor.

In one implementation, the antenna part further includes a flexible housing.

One or more of the present embodiments also provide a magnetic resonance imaging system that includes any one of the abovementioned local coils.

The local coil according to one or more of the present embodiments is lighter and more flexible, and may still adjust the frequency through the adjustment part after the antenna part is covered by the flexible material. Therefore, the local coil is more convenient to use, and the probability of scrap due to frequency mismatching drops greatly.

DETAILED DESCRIPTION

One or more of the present embodiments are further described in detail hereinbelow by way of examples.

One or more of the present embodiments provide a local coil that includes an antenna part, an adjustment part and a transmission part. The antenna part includes a first capacitor connected in series for adjusting the frequency of the antenna part. The adjustment part includes a tuning/detuning diode and is connected in parallel to the first capacitor. The tuning/detuning diode is used for adjusting tuning and detuning of the antenna part. The transmission part includes a radio-frequency transmission line that connects the antenna part and the adjustment part. The transmission part provides a phase difference of an odd multiple of 180° between the antenna part and the tuning/detuning diode.

One or more of the present embodiments use the radio-frequency transmission line to connect the antenna part and large elements (e.g., adjustment elements) so as to achieve the purpose of separating the antenna part from the large elements.

One or more of the present embodiments adopt a varactor diode to replace a mechanically adjustable variable capacitor, so as to adjust the frequency of the local coil after the antenna part is covered by the flexible material.

According to one or more of the present embodiments, most of the electronic components (e.g., the active detuning circuit or the passive detuning circuit) are moved outside the antenna part, with only a few capacitors being located inside the antenna part, so that the flexibility of the antenna part is further promoted to make the antenna part more flexible and more useful.

Particular Embodiment I

Figure 1:
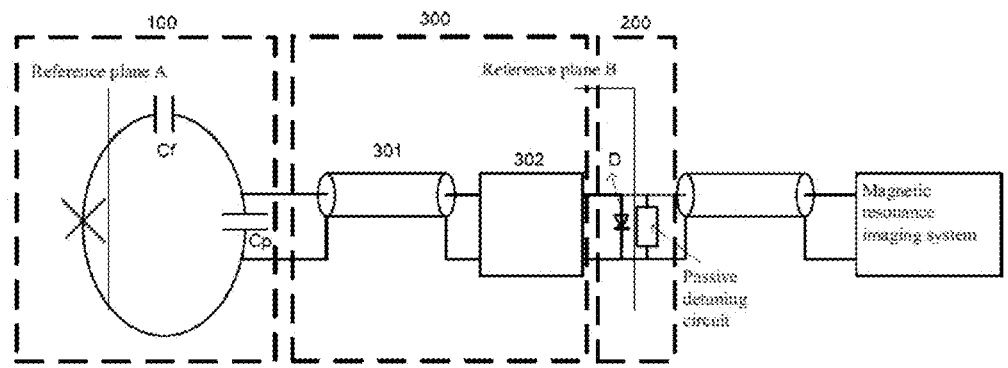
FIG. 1 shows one embodiment of a circuit diagram of a local coil.

FIG. 1 shows a circuit diagram of one embodiment of a local coil. As shown in FIG. 1, the local coil includes an antenna part 100, an adjustment part 200 and a transmission part 300. The antenna part 100 includes a first capacitor Cf and a second capacitor Cp that are connected in series. The adjustment part 200 is connected in parallel to the second capacitor Cp and is moved to a position far away from the antenna part 100. The transmission part 300 is connected between the antenna part 100 and the adjustment part 200.

In the antenna part 100, the first capacitor Cf is used for adjusting the frequency of the antenna part 100, the second capacitor Cp is used for adjusting the impedance matching of the antenna part 100, and in one or more of the present embodiments, the matching impedance of the antenna part 100 is 50 ohm. As shown in the embodiment in FIG. 1, the antenna part 100 only includes a capacitor. In actual use, however, the antenna part 100 further includes a fuse that is connected in series to the first capacitor Cf and the second capacitor Cp.

In the adjustment part 200, a tuning/detuning diode D connected in parallel to the second capacitor Cp adjusts the tuning and active detuning of the local coil. The adjustment part 200 further includes a passive detuning circuit connected in parallel to the tuning/detuning diode D.

In the transmission part 300, according to the transmission line theory, under the circumstance that a reflection phase angle difference between a reference plane A (e.g., antenna part 100) and a reference plane B (e.g., tuning/detuning diode D) is an odd multiple of 180° (e.g., 180° or 540°), if the reference plane A (e.g., antenna part 100) is in an open loop (e.g., the impedance is infinite) state, then the reference plane B (e.g., tuning/detuning diode D) will be in a short circuit (e.g., the impedance is zero) state. Conversely, if the tuning/detuning diode of the reference plane B (e.g., tuning/detuning diode D) is short circuited by a current of 100 mA, then the reference plane A (e.g., antenna part 100) will be in an open loop state, which is equivalent to transmission line conversion of an odd multiple of λ/4. Therefore, the transmission part 300 is to provide a phase difference of an odd multiple of 180° between the reference plane A (e.g., antenna part 100) and the reference plane B (e.g., tuning/detuning diode D).

For the local coil according to the particular embodiments, the transmission part 300 includes a radio-frequency transmission line 301, and the phase difference that the radio-frequency transmission line 301 may provide depends on the length and characteristic impedance of the radio-frequency transmission line 301. Therefore, the transmission part 300 of the local coil according to one or more of the present embodiments may obtain the length of the radio frequency transmission line 301 corresponding to the phase difference of an odd multiple of 180° according to the characteristic impedance of the radio frequency transmission line 301. However, under the circumstances that the length of the radio-frequency transmission line 301 is fixed or is limited so as not to be able to reach the phase difference of an odd multiple of 180°, the transmission part 300 further includes a phase converter 302, and the phase converter 302 may compensate for the phase difference between the reference plane A and the reference plane B based on the phase difference that the radio-frequency transmission line 301 has completed, thereby providing a phase difference of an odd multiple of 180° between the antenna part 100 and the tuning/detuning diode D.

The local coil according to one or more of the present embodiments is lighter and more flexible.

Particular Embodiment II

Figure 2:
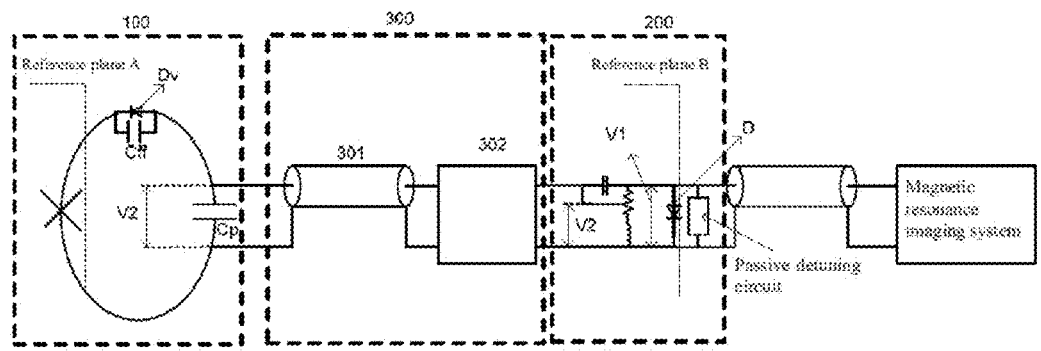
FIG. 2 shows one embodiment of a circuit diagram of a local coil.

FIG. 2 shows one embodiment of a circuit diagram of a local coil. As shown in FIG. 2, the local coil includes an antenna part 100, an adjustment part 200 and a transmission part 300. The antenna part 100 includes a first capacitor Cf and a second capacitor Cp that are connected in series. The adjustment part 200 is connected in parallel to the second capacitor Cp and is moved to a position far away from the antenna part 100. The transmission part 300 is connected between the antenna part 100 and the adjustment part 200.

In the antenna part 100, the first capacitor Cf is used for adjusting a frequency of the antenna part 100. The second capacitor Cp is used for adjusting the impedance matching of the antenna part 100. In one or more of the present embodiments, the matching impedance of the antenna part 100 is 50 ohm. The first capacitor of the antenna part 100 includes a varactor diode Dv. The capacitance value of the varactor diode Dv is inversely proportional to the backward voltage applied to the two ends thereof. The capacitance value of the varactor diode Dv is adjusted by changing the voltage across the two ends of the varactor diode Dv, so that the frequency of the antenna part 100 of the local coil may be adjusted. Alternatively, as shown in FIG. 2, the first capacitor Cf of the antenna part 100 includes a fixed value capacitor Cff and a varactor diode Dv, which are connected in parallel. The capacitance value of the first capacitor Cf is the sum of the capacitance values of the fixed value capacitor Cff and the varactor diode Dv. The capacitance value of the varactor diode Dv is inversely proportional to the backward voltage applied to the two ends thereof. The capacitance value of the varactor diode Dv is adjusted by changing the voltage across the two ends of the varactor diode Dv, so that the frequency of the antenna part 100 of the local coil may be adjusted.

In the adjustment part 200, a tuning/detuning diode D connected in parallel to the second capacitor Cp adjusts the tuning and active detuning of the local coil. The adjustment part 200 also includes a passive detuning circuit connected in parallel to the tuning/detuning diode D. In order to adjust the capacitance value of the varactor diode Dv, the voltage across the two ends of the varactor diode Dv is to be adjusted. As shown in FIG. 2, the adjustment part 200 of the local coil according to one or more of the present embodiments also includes a resistance voltage divider Tr. The resistance voltage divider Tr is connected in parallel to the first capacitor, so that the voltage value across the two ends of the varactor diode Dv is adjusted by adjusting the resistance partition of the resistance voltage divider Tr. In the process of frequency adjustment, a DC voltage V1 of 30 V in the system may be used, and the resistance voltage divider Tr is used to adjust the voltage V2 across the two ends of the varactor diode Dv.

In the transmission part 300, according to the transmission line theory, under the circumstances that a reflection phase angle difference between a reference plane A (e.g., antenna part 100) and a reference plane B (e.g., tuning/detuning diode D) is an odd multiple of 180° (e.g., 180° or 540°), if the reference plane A (antenna part 100) is in an open loop state (e.g., the impedance is infinite), then the reference plane B (e.g., tuning/detuning diode D) will be in a short circuit (e.g., the impedance is zero) state. Conversely, if the tuning/detuning diode of the reference plane B (e.g., tuning/detuning diode D) is short circuited by a current of 100 mA, then the reference plane A (e.g., antenna part 100) will be in an open loop state, which is equivalent to transmission line conversion of an odd multiple of λ/4. Therefore, the transmission part 300 is to provide a phase difference of an odd multiple of 180° between the reference plane A (e.g., antenna part 100) and the reference plane B (e.g., tuning/detuning diode D).

For the local coil according to one or more of the present embodiments, the transmission part 300 includes a radio-frequency transmission line 301, and the phase difference that the radio-frequency transmission line 301 may provide depends on the length and the characteristic impedance of the radio-frequency transmission line 301. Therefore, the transmission part 300 of the local coil may obtain the length of the radio-frequency transmission line 301 corresponding to the phase difference of an odd multiple of 180° according to the characteristic impedance of the radio-frequency transmission line 301. However, under the circumstance that the length of the radio-frequency transmission line 301 is fixed or is limited so as not to be able to reach the phase difference of an odd multiple of 180°, the transmission part 300 further includes a phase converter 302, and the phase converter 302 may compensate for the phase difference between the reference plane A and the reference plane B based on the phase difference that the radio-frequency transmission line 301 has completed, thereby providing a phase difference of an odd multiple of 180° between the antenna part 100 and the tuning/detuning diode D.

The local coil according to one or more of the present embodiments is lighter and more flexible, and may still adjust the frequency through the adjustment part after the antenna part is covered by the flexible material. Therefore, the local coil is more convenient to use, and the probability of scrap due to frequency mismatching drops greatly.

By the abovementioned embodiments, a person skilled in the art may fabricate a thinner and more flexible local coil, while also solving the problem of scrap due to the mismatching of the frequency of the local coil and the operating frequency of the system after a flexible material is included therein. Based on the abovementioned embodiments, a 150 mm×90 mm mini size four-channel dedicated local coil may be fabricated. The antenna part in the local coil is integrated to be very thin, with only some capacitors being placed in the flexible antenna. Thus, the flexible antenna is very good in flexibility and may be applied to a variety of magnetic resonance occasions.

Figure 3A:
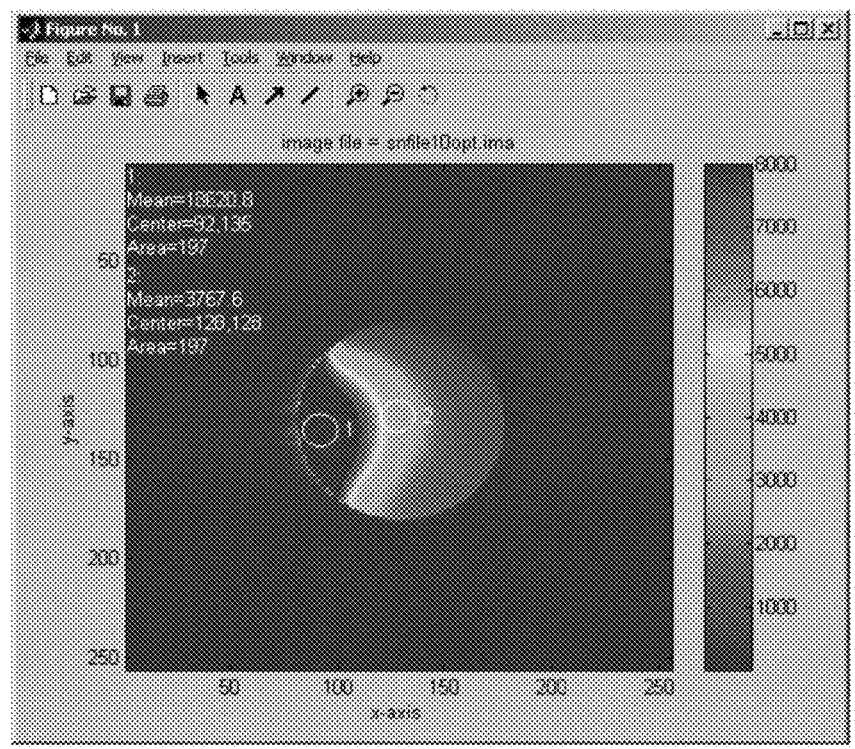
FIG. 3A shows a magnetic resonance imaging signal to noise ratio distribution diagram of the prior art.
Figure 3B:
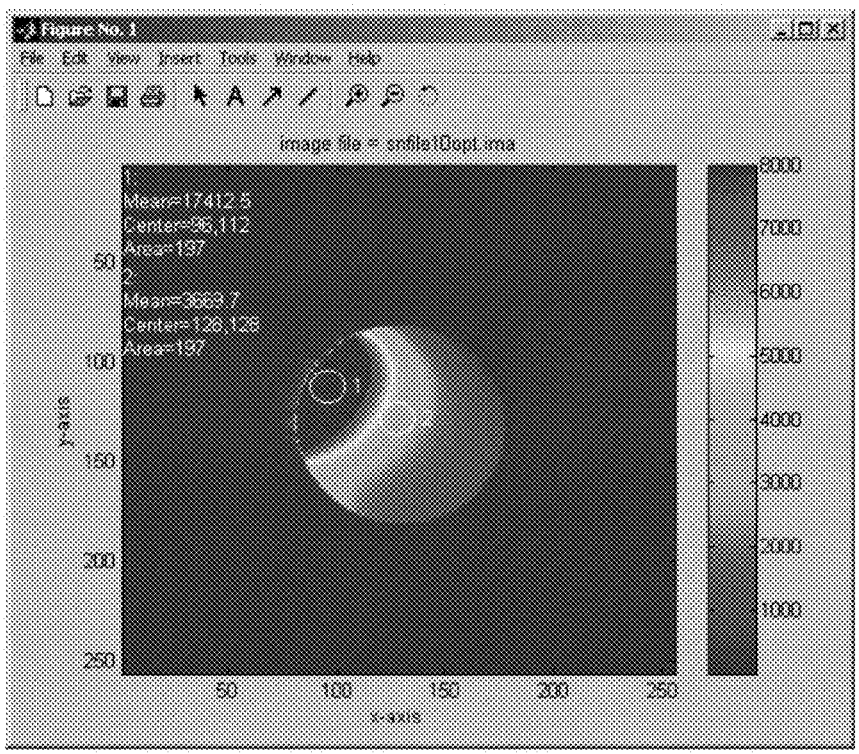
FIG. 3B shows an exemplary magnetic resonance imaging signal to noise ratio distribution diagram.

In order to test the feasibility of one or more of the present embodiments, a 4-channel coil sample may be fabricated. Some experiments are done in the magnetic resonance imaging system. FIG. 3A is a magnetic resonance imaging signal to noise ratio distribution diagram of the prior art (e.g., a mechanical adjustment sheet is embedded therein), and FIG. 3B is a magnetic resonance imaging signal to noise ratio distribution diagram according to one or more of the present embodiments, where two selected zones 1 and 2 are shown. Table 1 gives the experimental results of the selected zones 1 and 2, as shown in FIG. 3. After comparison, the signal to noise ratios of the two designs are almost the same under the same reference point. The difference of the signal to noise ratio section is due to different placement angles, but the coil element and the image may be made at the same distance. Therefore, the following comparison is provided.

TABLE 1

| Selected zone | Signal to noise ratio of previous design | Signal to noise ratio of an embodiment | Ratio of signal to noise ratios (an embodiment/ previous design) |
|---|---|---|---|
| 1 | 18620.8 | 17412.5 | 0.935110199 |
| 2 | 3767.6 | 3669.7 | 0.974015288 |

In order to build a magnetic resonance coil that is larger in flexibility and smaller in size, the a four-channel dedicated coil having an antenna part with complete flexibility and thinness may be adopted as a sample to describe the specific implementation details of this solution. The test result of the signal to noise ratio of the sample corresponds to the current product.

What are mentioned above are merely embodiments, and the embodiments are not intended to limit the protection scope. In the implementation process, an appropriate improvement may be performed according to one or more of the present embodiments so as to adapt to specific needs of specific circumstances. Therefore, the implementation manners mentioned only play a demonstrative role, and the implementations are not intended to limit the protection scope of the present invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil comprising:
an antenna part;
an adjustment part; and
a transmission part,
wherein the antenna part comprises a first capacitor connected in series to a second capacitor, the first capacitor for adjusting a frequency of the antenna part,
wherein the first capacitor comprises a varactor diode,
wherein the adjustment part comprises a tuning/detuning diode and is connected in parallel to the second capacitor, and the tuning/detuning diode is operable to adjust tuning and detuning of the antenna part,
wherein the adjustment part is moved to a position away from the antenna part,
wherein the adjustment part further comprises a voltage divider for adjusting the voltage across the varactor diode,
wherein the voltage divider is a resistance voltage divider connected in parallel to the tuning/detuning diode, and
wherein the transmission part comprises a radio-frequency transmission line that connects the antenna part and the adjustment part, and the transmission part provides a phase difference of an odd multiple of 180° between the antenna part and the tuning/detuning diode.

2. The local coil of claim 1, wherein the transmission part further comprises a phase converter connected between the radio-frequency transmission line and the tuning/detuning diode.

3. The local coil of claim 2, wherein the phase converter is a π-shaped or T-shaped phase conversion circuit.

4. The local coil of claim 1, wherein the first capacitor further comprises a fixed value capacitor connected in parallel to the varactor diode.

5. The local coil of claim 1, wherein the second capacitor is configured for adjusting a matching impedance flexible housing of the antenna part; and
a fuse is connected in series to the first capacitor.

6. The local coil of claim 1, wherein the antenna part further comprises a flexible housing.

7. A magnet resonance imaging system comprising:
a local coil comprising:
an antenna part;
an adjustment part; and
a transmission part,
wherein the antenna part comprises a first capacitor connected in series to a second capacitor, the first capacitor for adjusting a frequency of the antenna part,
wherein the first capacitor comprises a varactor diode,
wherein the adjustment part comprises a tuning/detuning diode and is connected in parallel to the second capacitor, and the tuning/detuning diode is operable to adjust tuning and detuning of the antenna part,
wherein the adjustment part is positioned away from the antenna part,
wherein the adjustment part further comprises a voltage divider for adjusting the voltage across the varactor diode,
wherein the voltage divider is a resistance voltage divider connected in parallel to the tuning/detuning diode, and
wherein the transmission part comprises a radio-frequency transmission line that connects the antenna part and the adjustment part, and the transmission part provides a phase difference of an odd multiple of 180° between the antenna part and the tuning/detuning diode.

8. The magnet resonance imaging system of claim 7, wherein the transmission part further comprises a phase converter connected between the radio-frequency transmission line and the tuning/detuning diode.

9. The magnet resonance imaging system of claim 8, wherein the phase converter is a π-shaped or T-shaped phase conversion circuit.

10. The magnet resonance imaging system of claim 7, wherein the first capacitor further comprises a fixed value capacitor connected in parallel to the varactor diode.

11. The magnet resonance imaging system of claim 7, wherein the second capacitor is configured for adjusting a matching impedance flexible housing of the antenna part; and
a fuse is connected in series to the first capacitor.

12. The magnet resonance imaging system of claim 7, wherein the antenna part further comprises a flexible housing.

* * * * *